United States Patent
Godet et al.

(10) Patent No.: US 11,581,189 B2
(45) Date of Patent: Feb. 14, 2023

(54) CONTROLLED HARDMASK SHAPING TO CREATE TAPERED SLANTED FINS

(71) Applicant: Applied Materials, Inc., Santa Clara, CA (US)

(72) Inventors: Ludovic Godet, Sunnyvale, CA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/344,700

(22) Filed: Jun. 10, 2021

(65) Prior Publication Data
US 2021/0305055 A1 Sep. 30, 2021

Related U.S. Application Data

(63) Continuation of application No. 16/663,970, filed on Oct. 25, 2019, now Pat. No. 11,171,010.

(60) Provisional application No. 62/753,847, filed on Oct. 31, 2018.

(51) Int. Cl.
| | |
|---|---|
| *H01L 21/304* | (2006.01) |
| *H01L 21/308* | (2006.01) |
| *H01L 21/263* | (2006.01) |
| *H01L 21/3065* | (2006.01) |

(52) U.S. Cl.
CPC ...... *H01L 21/3083* (2013.01); *H01L 21/2633* (2013.01); *H01L 21/3065* (2013.01)

(58) Field of Classification Search
CPC .................. H01L 21/2633; H01L 21/3043
See application file for complete search history.

(56) References Cited

U.S. PATENT DOCUMENTS

| | | |
|---|---|---|
| 2007/0238031 A1 | 10/2007 | Lee et al. |
| 2015/0118604 A1 | 4/2015 | Dynes et al. |
| 2017/0003505 A1 | 1/2017 | Vallius et al. |
| (Continued) | | |

FOREIGN PATENT DOCUMENTS

| | | |
|---|---|---|
| CN | 101241842 A | 8/2008 |
| CN | 101556937 A | 10/2009 |
| (Continued) | | |

OTHER PUBLICATIONS

Chinese Office Action issued to Application No. 201980064955.4 dated Jun. 6, 2022.

(Continued)

*Primary Examiner* — Thomas T Pham
(74) *Attorney, Agent, or Firm* — Patterson + Sheridan, LLP

(57) ABSTRACT

Embodiments described herein relate to methods forming optical device structures. One embodiment of the method includes exposing a substrate to ions at an ion angle relative to a surface normal of a surface of the substrate to form an initial depth of a plurality of depths. A patterned mask is disposed over the substrate and includes two or more projections defining exposed portions of the substrate or a device layer disposed on the substrate. Each projection has a trailing edge at a bottom surface contacting the device layer, a leading edge at a top surface of each projection, and a height from the top surface to the device layer. Exposing the substrate to ions at the ion angle is repeated to form at least one subsequent depth of the plurality of depths.

20 Claims, 16 Drawing Sheets

(56) References Cited

U.S. PATENT DOCUMENTS

| | | | |
|---|---|---|---|
| 2018/0047564 A1 | 2/2018 | Park et al. | |
| 2018/0047632 A1 | 2/2018 | Zhang et al. | |
| 2018/0182623 A1 | 6/2018 | Lee et al. | |
| 2018/0364404 A1 | 12/2018 | Yeo et al. | |
| 2020/0027832 A1* | 1/2020 | Varghese | H01L 21/76885 |

FOREIGN PATENT DOCUMENTS

| | | |
|---|---|---|
| CN | 103904170 | 7/2014 |
| CN | 104425229 A | 3/2015 |
| JP | H01231327 A | 9/1989 |
| JP | 2010096958 A1 | 4/2010 |
| JP | 2018037648 A | 3/2018 |
| KR | 10-2016-0069022 A | 6/2016 |
| KR | 2020160069022 A | 6/2016 |
| WO | 2018057345 A1 | 3/2018 |

OTHER PUBLICATIONS

Japanese Office Action issued to Application No. 2021-522948 dated Jul. 5, 2022.

* cited by examiner

CONTROLLED HARDMASK SHAPING TO CREATE TAPERED SLANTED FINS

CROSS-REFERENCE TO RELATED APPLICATIONS

This application is continuation of U.S. patent application Ser. No. 16/663,970, filed Oct. 25, 2019, which claims priority to U.S. Provisional Patent Application Ser. No. 62/753,847, filed on Oct. 31, 2018, both of which are herein incorporated by reference.

BACKGROUND

Field

Embodiments of the present disclosure generally relate to optical devices for augmented, virtual, and mixed reality. More specifically, embodiments described herein provide for optical device fabrication with tapered fins.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Optical devices, such as waveguides, are used to assist in overlaying images. Generated light is propagated through an optical device until the light exits the optical device and is overlayed on the ambient environment. Fabricating optical devices can be challenging as optical devices tend to have non-uniform properties. Accordingly, what is needed in the art are improved optical devices and methods of fabrication.

SUMMARY

In one embodiment, a method is provided. The method includes exposing a substrate to ions at an ion angle relative to a surface normal of a surface of the substrate to form an initial depth of a plurality of depths. A patterned multilayer mask is disposed over the substrate and includes an initial patterned mask disposed over the substrate with two or more initial projections defining exposed portions of the substrate or a device layer disposed on the substrate. Each initial projection has a trailing edge at a bottom surface disposed over the substrate. At least one subsequent patterned mask with two or more subsequent projections is disposed over each initial projection of the initial patterned mask. Each subsequent projection includes a leading edge at a top surface of each subsequent projection and a height from the top surface to each initial projection. Exposing the substrate to ions at the ion angle is repeated to form at least one subsequent depth of the plurality of depths.

In another embodiment, a method is provided. The method includes exposing a substrate to ions at an ion angle relative to a surface normal of a surface of the substrate to form an initial depth of a plurality of depths, wherein a patterned mask disposed over the substrate and includes two or more projections defining exposed portions of the substrate or a device layer disposed on the substrate. Each projection has a trailing edge at a bottom surface contacting the device layer, a leading edge at a top surface of each projection, and a height from the top surface to the device layer. Exposing the substrate to ions at the ion angle is repeated to form at least one subsequent depth of the plurality of depths.

In yet another embodiment, a method is provided. The method includes exposing a device layer disposed over a substrate to ions contacting the device layer at an ion angle relative to a surface normal of a surface of the substrate to form an initial depth of a plurality of depths. A patterned multilayer mask is disposed on the device layer and includes an initial patterned mask disposed on the device layer with two or more initial projections defining exposed portions of the device layer. Each initial projection has a trailing edge at a bottom surface contacting the device layer. The initial patterned mask includes a first material with a first erosion rate. At least one subsequent patterned mask with two or more subsequent projections is disposed over each initial projection of the initial patterned mask. Each subsequent projection includes a leading edge at a top surface of each subsequent projection and a height from the top surface to each initial projection. Exposing the substrate to ions at the ion angle is repeated to form at least one subsequent depth of the plurality of depths.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods of forming optical device structures with tapered fins. The methods include exposing a substrate to ions contacting the substrate or a device layer disposed on the substrate at an ion angle relative to a surface normal of a surface of the substrate. The utilization of hardmask shaping, i.e., controlling a distance between a leading edge plane defined by the leading edge of the patterned mask and a trailing edge plane defined by the trailing edge of the patterned mask, increases a linewidth of each fin and the depth of the fin, which enables the formation of tapered fins in the substrate or device layer of the optical device structures.

Figure 1:
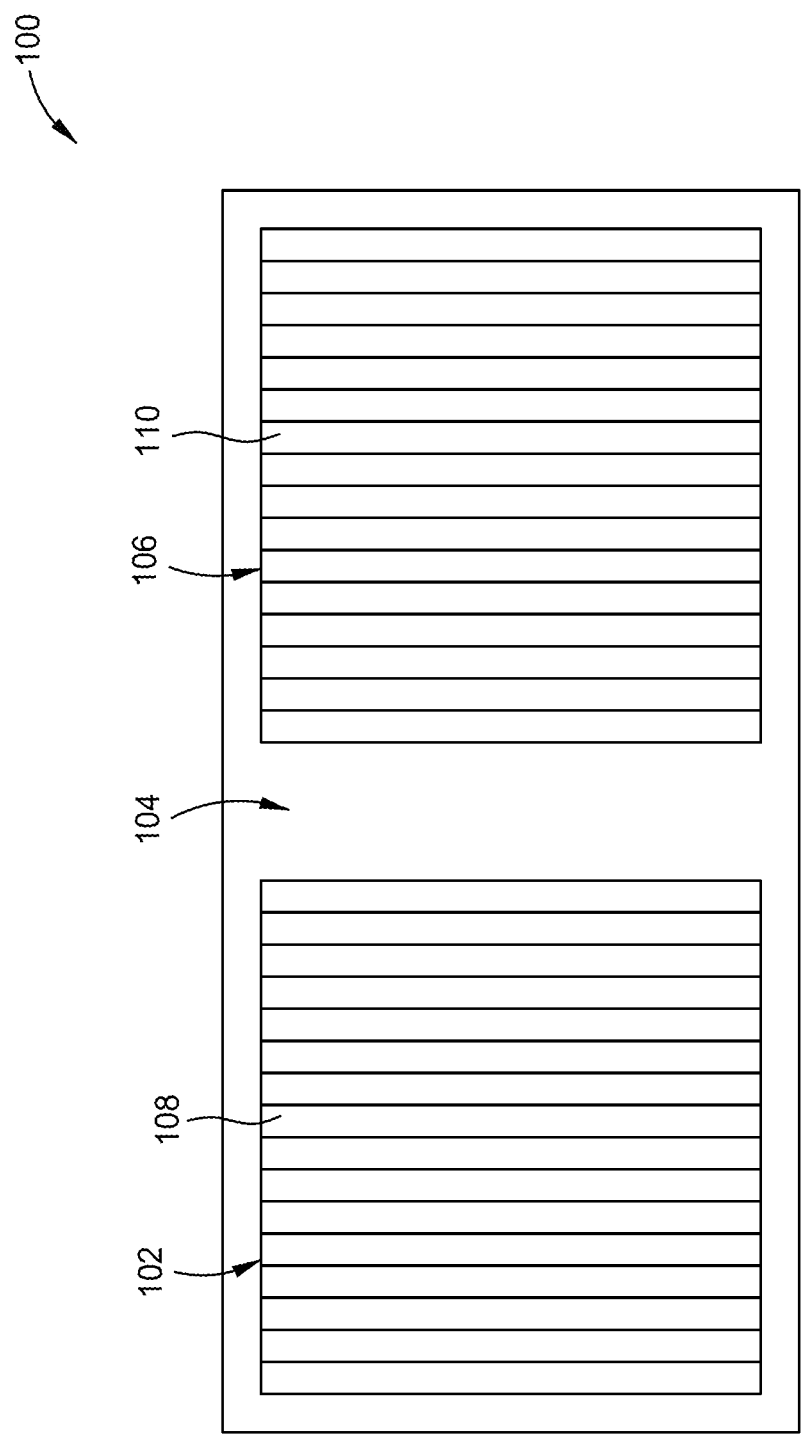
FIG. 1 is a front view of an optical device according to an embodiment.

FIG. 1 is a front view of an optical device 100. It is to be understood that the optical device 100 described below is an exemplary optical device. The optical device 100 includes an input coupling region 102 defined by a plurality of fins 108, an optical device region 104, and an output coupling region 106 defined by a plurality of fins 110.

The input coupling region 102 receives incident beams of light (a virtual image) having an intensity from a microdisplay. Each fin of the plurality of fins 108 splits the incident beams into a plurality of modes, each beam having a mode. Zero-order mode (T0) beams are refracted back or lost in the optical device 100, positive first-order mode (T1) beams undergo total-internal-reflection (TIR) through the optical device 100 across the optical device region 104 to the output coupling region 106, and negative first-order mode (T−1) beams propagate in the optical device 100 a direction opposite to the T1 beams. The T1 beams undergo total-internal-reflection (TIR) through the optical device 100 until the T1 beams come in contact with the plurality of fins 110 in the output coupling region 106. The T1 beams contact a fin of the plurality of fins 110 where the T1 beams are split into T0 beams refracted back or lost in the optical device 100, T1 beams that undergo TIR in the output coupling region 106 until the T1 beams contact another fin of the plurality of fins 110, and T−1 beams coupled out of the optical device 100. One approach to control the T1 beams coupled through the optical device 100 to the output coupling region 106 and to control the T−1 beams coupled out of the optical device 100 is to control the shape of each fin of the plurality of fins 108 and the plurality of fins 110. A tapered shape for each fin of the plurality of fins 108 and the plurality of fins 110 provides for modulation the field of view and increased optical bandwidth.

Figure 2:
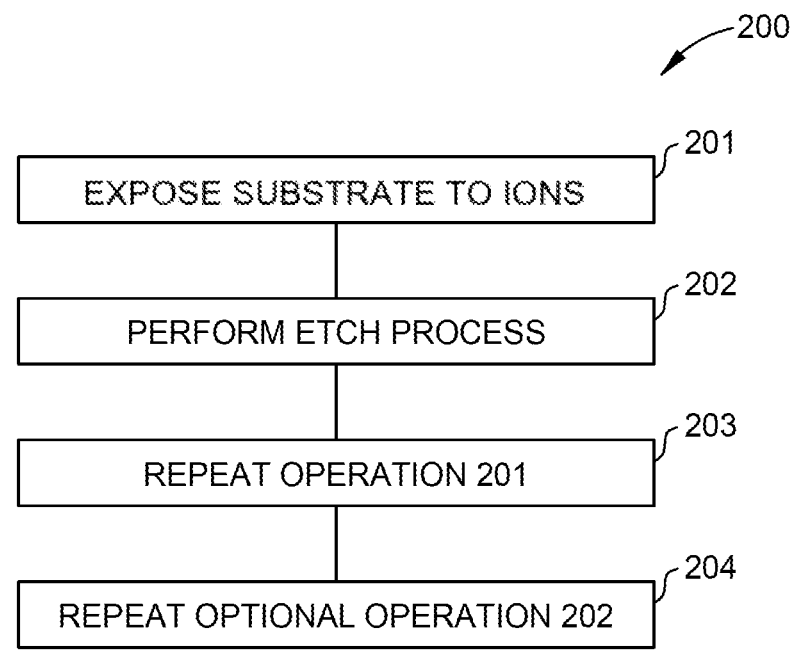
FIG. 2 is a flow diagram of a method for forming an optical device structure according to an embodiment.
Figure 3A:
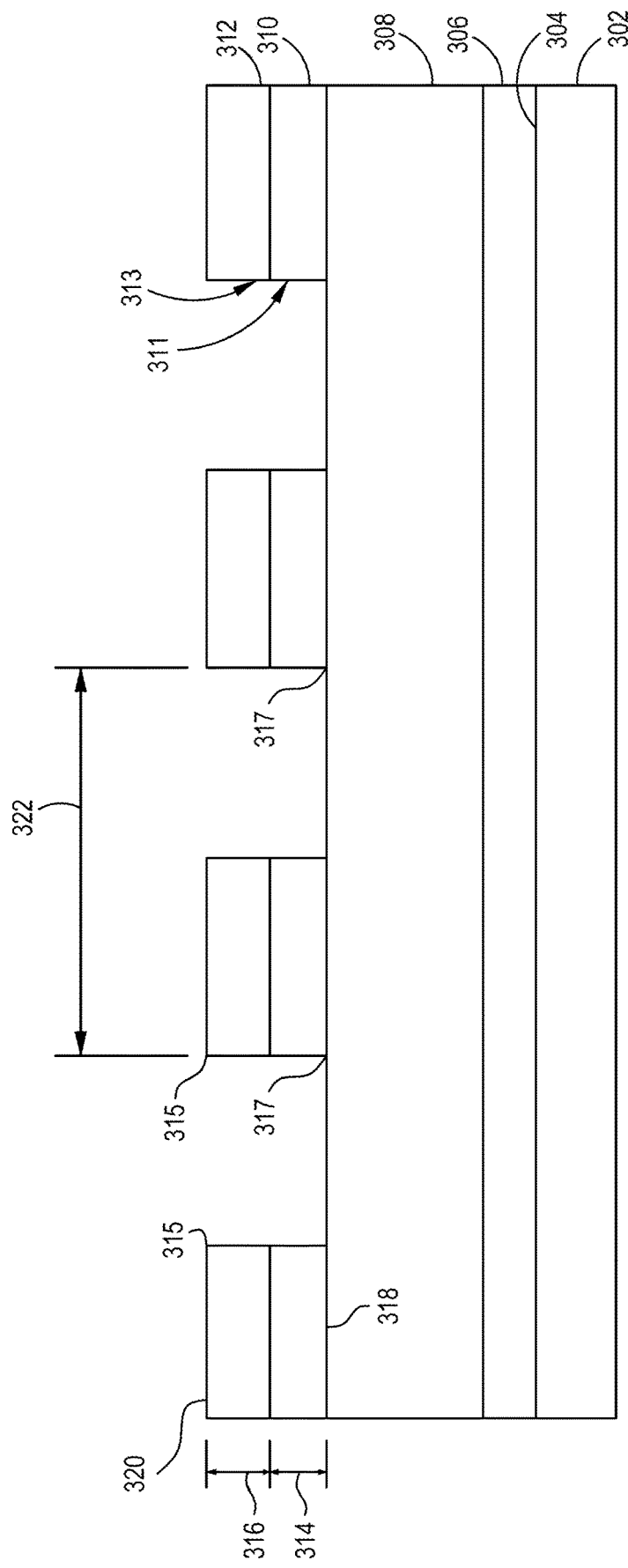
FIGS. 3A-3G are schematic, cross-sectional views of an optical device structure during a method for forming an optical device structure according to an embodiment.
Figure 3B:
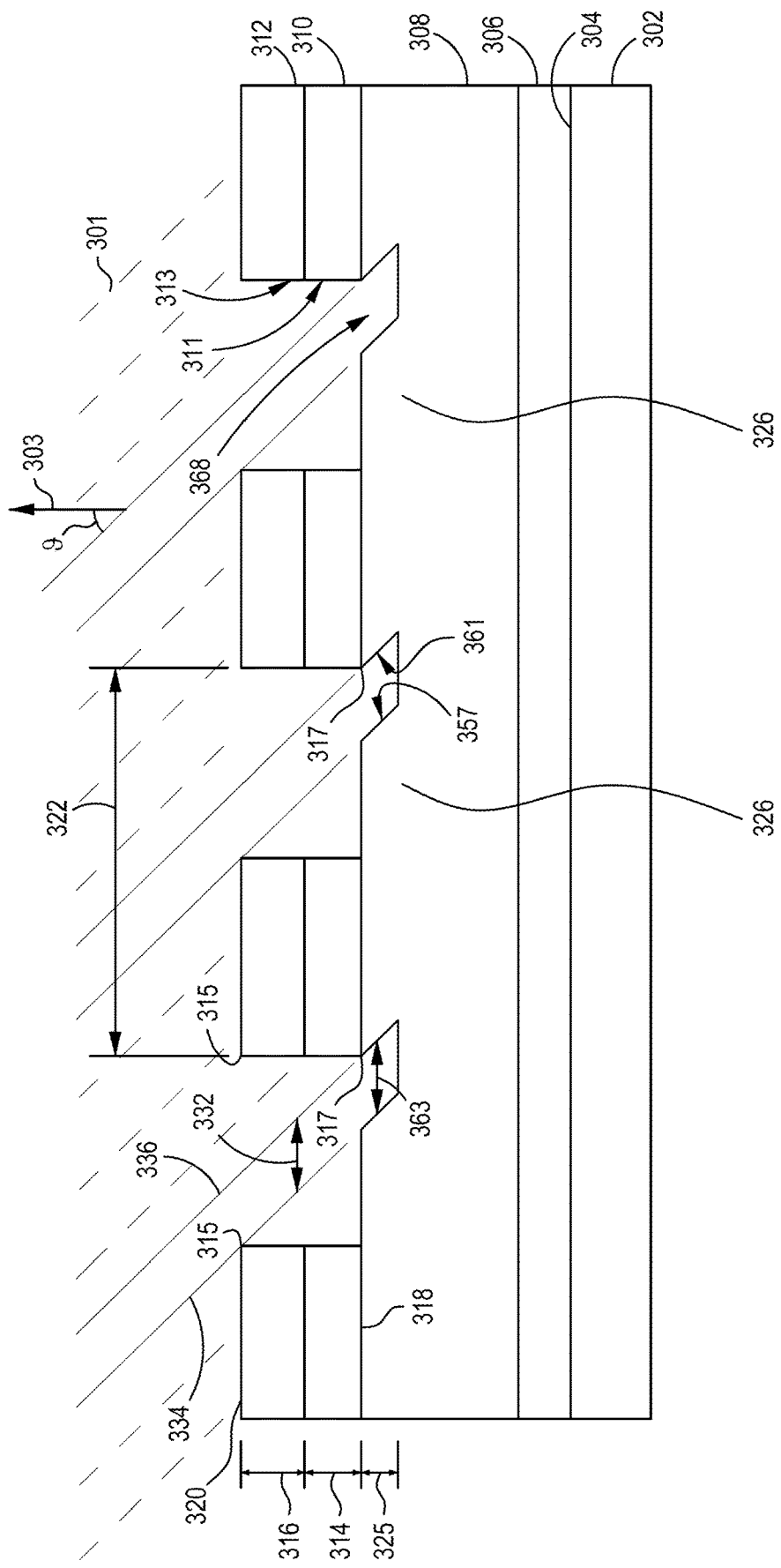
Figure 3C:
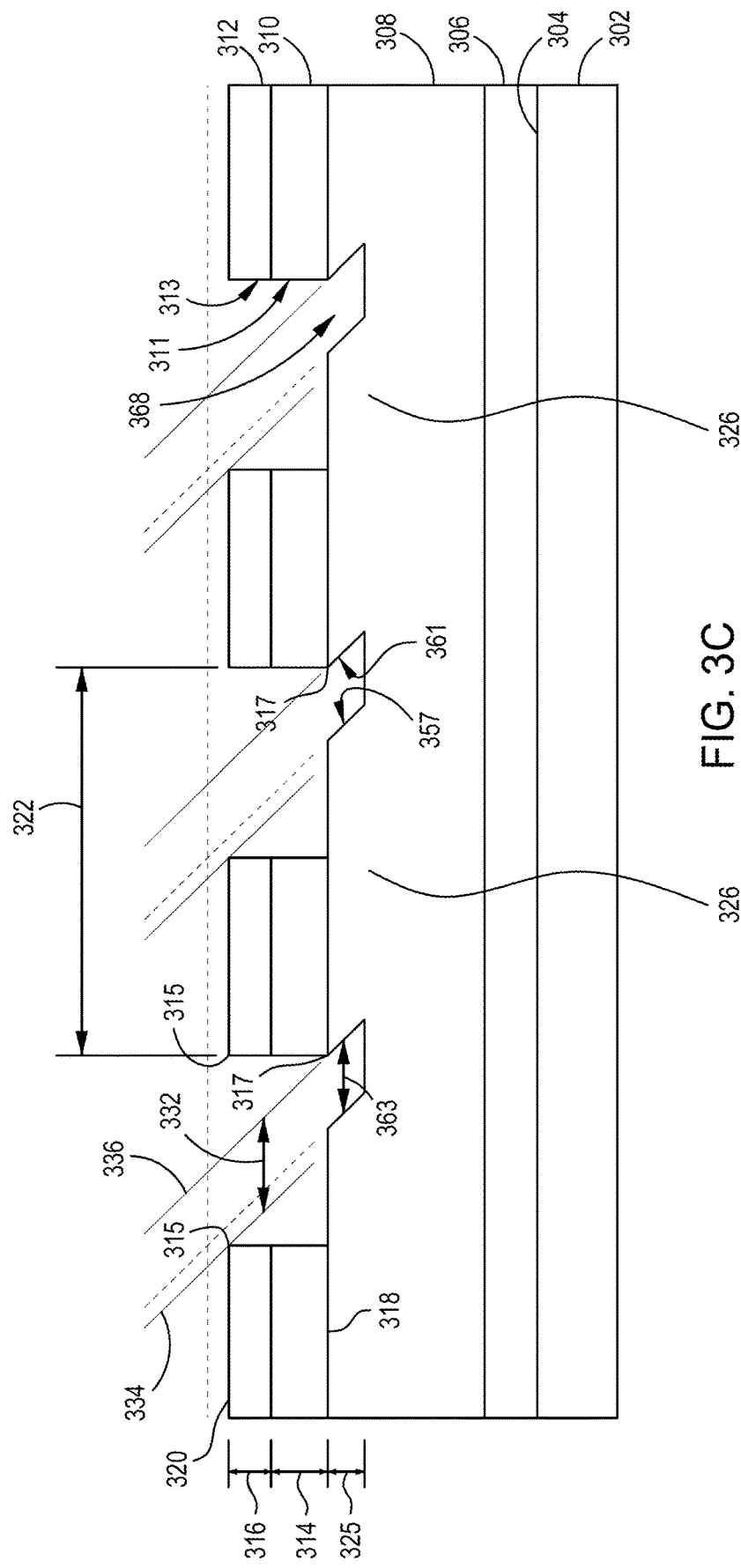
Figure 3D:
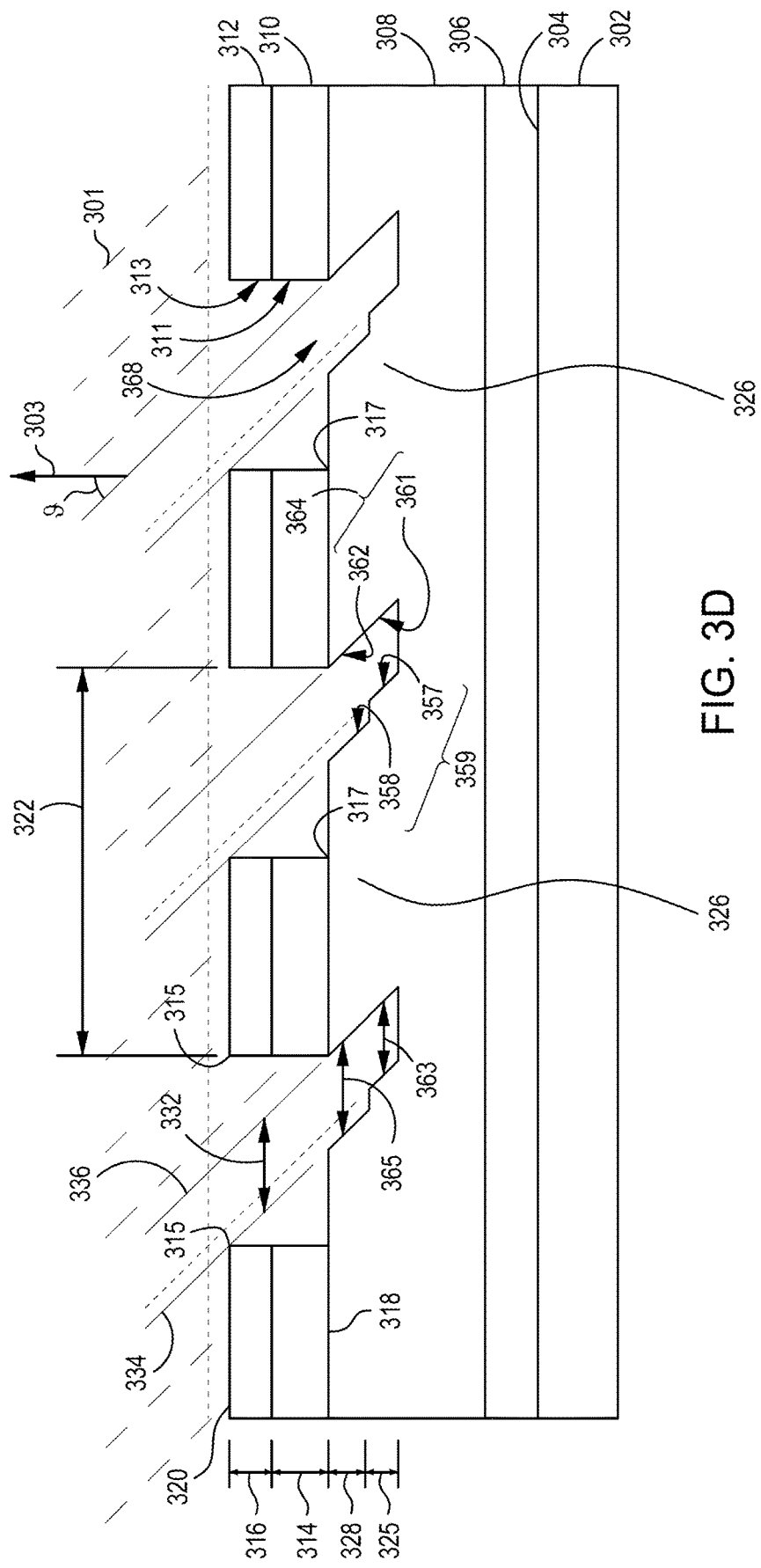
Figure 3E:
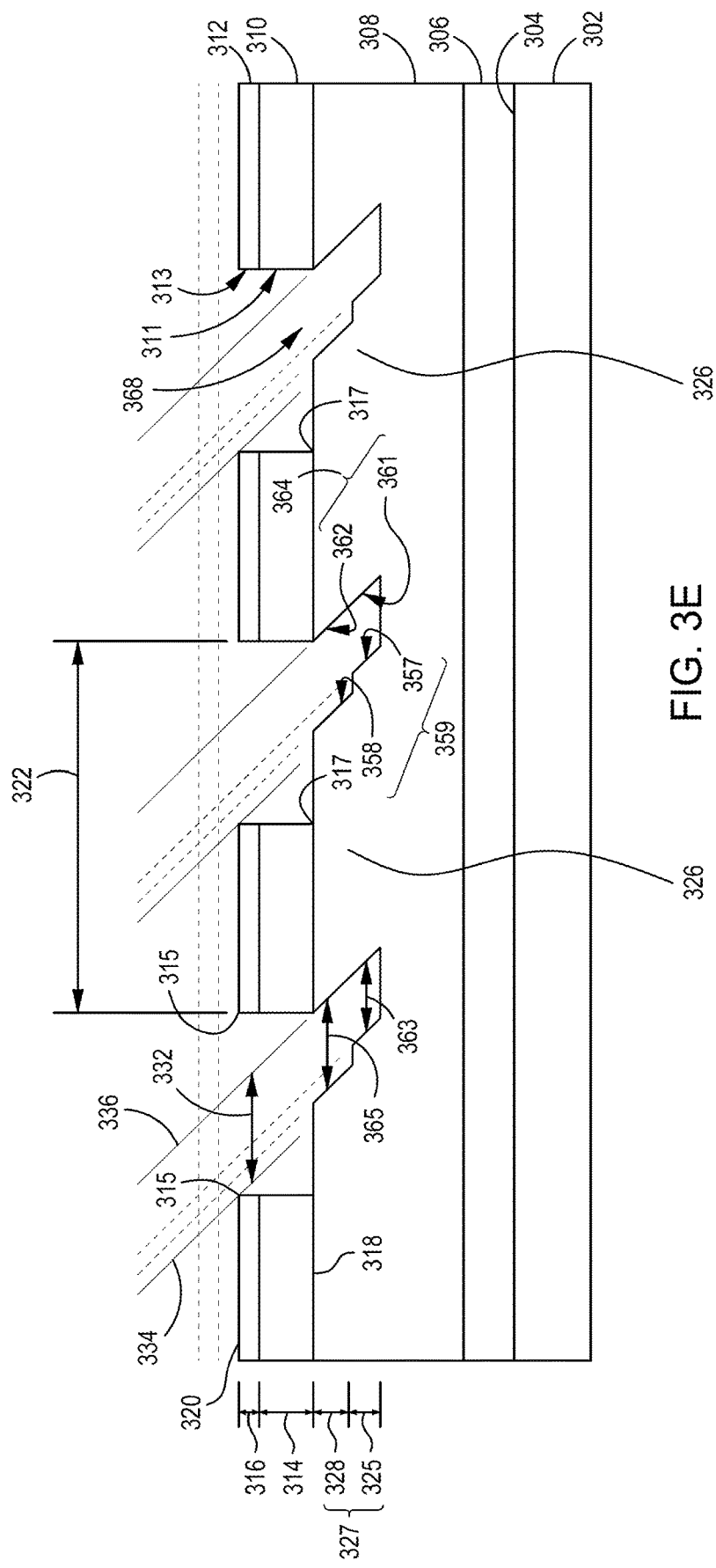
Figure 3F:
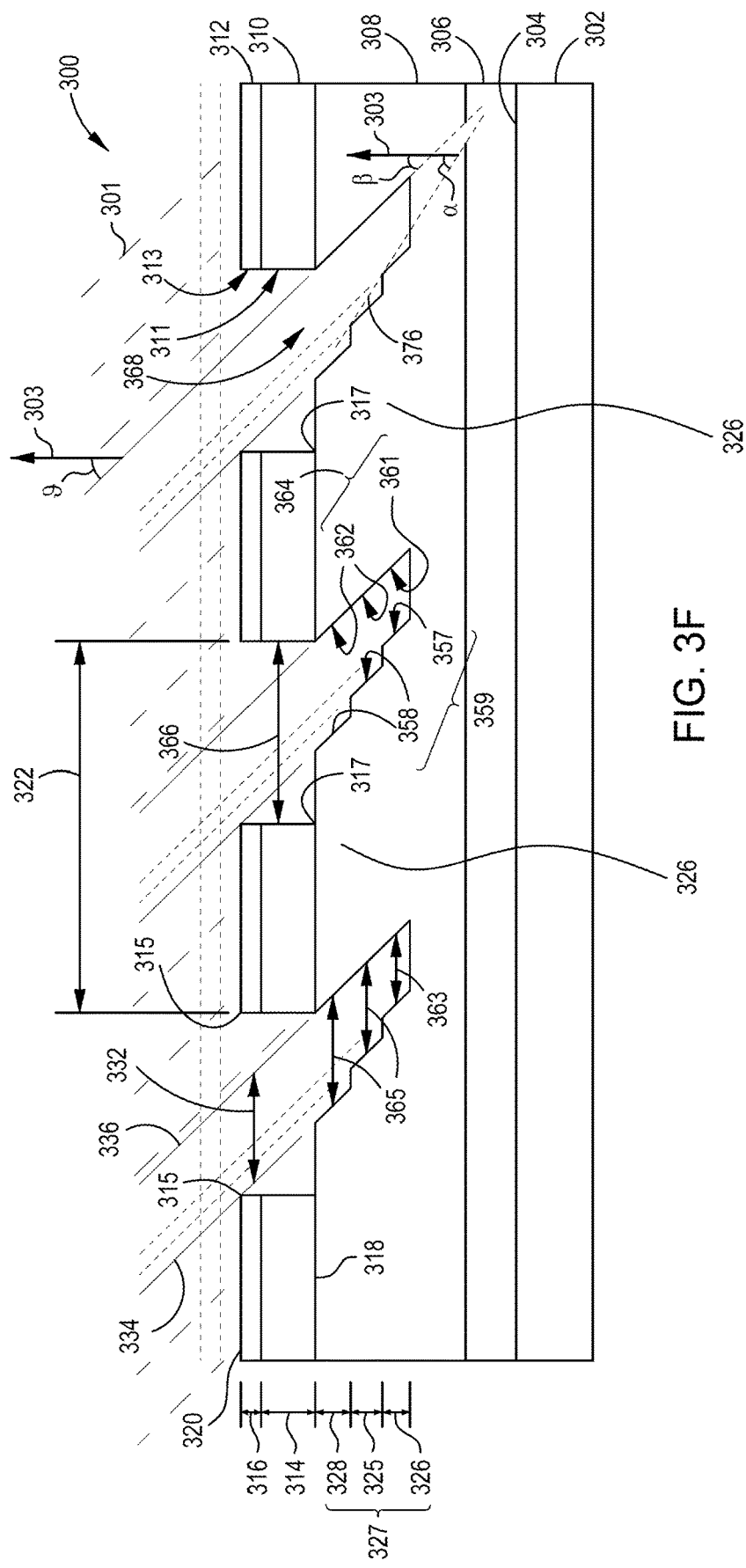
Figure 3G:
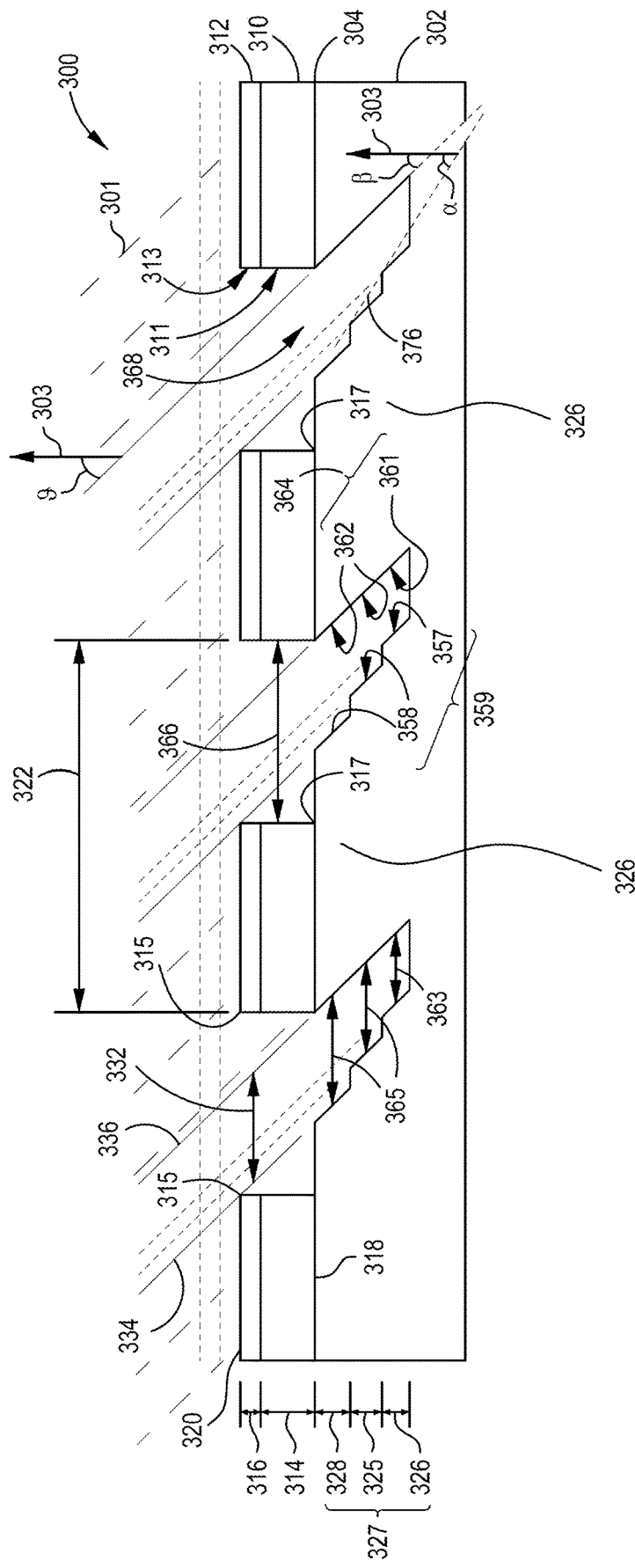

FIG. 2 is a flow diagram of a method 200 for forming an optical device structure 300 shown in FIGS. 3A-3G. In one embodiment, the optical device structure 300 corresponds to the input coupling region 102 and/or the output coupling region 106 of the optical device 100. At operation 201, a substrate 302 is exposed to ions 301, such as ion beams. In one embodiment, which can be combined with other embodiments described herein, the ions 301 contact the substrate 302 at an ion angle ϑ relative to a surface normal 303 of the surface 304 of the substrate 302. In another embodiment, which can be combined with other embodiments described herein, a device layer 308 is disposed over the substrate 302 such that the ions 301 contact the device layer 308 at the ion angle ϑ relative to the surface normal 303 of the surface 304 of the substrate 302. In yet another embodiment, which can be combined with other embodiments described herein, an etch stop layer 306 is disposed between the device layer 308 and the surface 304 of the substrate 302. As shown in FIG. 3F, when the device layer 308 is disposed over the substrate 302, the optical device structure 300 includes at least one fin 326 formed in the device layer 308. Otherwise, as shown in FIG. 3G, the optical device structure 300 includes at least one fin 326 formed in the substrate 302. While aspects of forming at least one fin 326 in the device layer 308 are discussed, it is to be understood that at least one fin 326 in the substrate 302 is similarly formed without the device layer 308 disposed thereon.

Exposing one of the substrate 302 to the ions 301 at the ion angle ϑ may include etching processes such as angled ion etching and directional reactive ion etching (RIE) that accelerate ions 301 to the substrate 302. Angled ion etching includes generating an ion beam, such as a ribbon beam, a spot beam, or full substrate-size beam, and directing the ion beam at the ion angle ϑ to the device layer 308. The ion beam has an etch chemistry corresponding to a gas or gas mixture activated to generate the ion beam. One example of an angled ion etch system is the Varian VIISta® system available from Applied Materials, Inc. located in Santa Clara, Calif. Directional RIE includes exciting a gas or gas mixture, also known as an etch chemistry, into a plasma by applying a radio frequency (RF) power to the gas or gas mixture and directing ions of the plasma at the ion angle ϑ to the substrate 302.

In one embodiment, which can be combined with other embodiments described herein, the device layer 308 includes, but in not limited to, at least one of silicon oxycarbide (SiOC), titanium dioxide (TiO$_2$), silicon dioxide (SiO$_2$), vanadium (IV) oxide (VO$_x$), aluminum oxide (Al$_2$O$_3$), indium tin oxide (ITO), zinc oxide (ZnO), tantalum pentoxide (Ta$_2$O$_5$), silicon nitride (Si$_3$N$_4$), titanium nitride (TiN), zirconium dioxide (ZrO$_2$), and silicon carbon-nitride (SiCN) containing materials. The substrate 302 includes, but is not limited to, at least one of amorphous dielectrics, non-amorphous dielectrics, crystalline dielectrics, silicon oxide, polymers, and combinations thereof. In some embodiments, which can be combined with other embodiments described herein, the substrate 302 includes, but in not limited to, at least one of an oxide, sulfide, phosphide, telluride, and combinations thereof. In one example, the substrate 302 includes at least one of silicon (Si), silicon dioxide (SiO$_2$), sapphire, and high-index transparent materials containing materials.

As shown in FIG. 3A, prior to operation 201, a patterned multilayer mask is disposed on one of the device layer 308 and the substrate 302. The patterned multilayer mask includes an initial patterned mask 310 and at least one subsequent patterned mask 312. The initial patterned mask 310 is disposed on one of the device layer 308 and the substrate 302. The initial patterned mask 310 includes two or more initial projections 311 defining exposed portions of the device layer 308 (or the substrate 302). The at least one subsequent patterned mask 312 with two or more projections 313 is disposed over the initial patterned mask 310. The two or more projections 313 are substantially aligned with the two or more projections 311. Each projection 313 includes a leading edge 315 at a top surface 320 of each projection 313. Each projection 311 has a trailing edge 317 at a bottom surface 318 contacting the device layer 308 (or the substrate 302). The initial patterned mask 310 includes a pitch 322 between adjacent trailing edges 317. Each projection 311 has a first height 314 from the bottom surface 318 to the subsequent patterned mask 312. Each projection 313 has a second height 316 from the initial patterned mask 310 to the top surface 320. Prior to operation 201, the first height 314 and the second height 316 are substantially the same.

FIG. 3B is a schematic, cross-sectional view of the substrate 302 at operation 201. As shown in FIG. 3B, ions 301 contact the device layer 308 (or the substrate 302) at the ion angle ϑ relative to a surface normal 303 of the surface 304 of the substrate 302. The ions 301 etch an initial depth 325 of a plurality of depths 327 (shown in FIGS. 3D-3F) of at least one cavity 368 into the device layer 308 or the substrate 302 (FIG. 3G). As shown in FIGS. 3D-3G, each cavity 368 is between two adjacent fins 326. After operation 201, in addition to the initial depth 325, the at least one cavity 368 includes an initial leading sidewall portion 357 of a leading sidewall 359 (shown in FIGS. 3F and 3G), an initial trailing sidewall portion 361 of a trailing sidewall 364 (shown in FIGS. 3F and 3G), and an initial linewidth 363 from the initial leading sidewall portion 357 to the initial trailing sidewall portion 361. The initial leading sidewall portion 357 has an initial leading angle $\alpha_i$ corresponding to the ion angle ϑ relative to the surface normal 303. The initial trailing sidewall portion 361 has an initial trailing angle $\beta_i$ corresponding to the ion angle ϑ relative to the surface normal 303. The initial linewidth 363 is controlled by a distance 332 between a leading edge plane 334 defined by the leading edge 315 at a top surface 320 of each projection 313 and a trailing edge plane 336 defined by the trailing edge 317 at a bottom surface 318 contacting the device layer 308 (or the substrate 302). The distance 332 corresponds to the initial linewidth 363 as the ions 301 at the ion angle ϑ do not contact the device layer 308 (or the substrate 302) outside of the distance 332. The second height 316 is controlled, i.e., decreased, such that distance 332 is increased for at least one subsequent linewidth 365 (shown in FIGS. 3D-3G).

As shown in FIG. 3C, after operation 201, the second height 316 is decreased. The subsequent patterned mask 312 includes a second material with a second erosion rate and the initial patterned mask 310 includes a first material with a first erosion rate. In one embodiment, which can be combined with other embodiments described herein, the first material includes at least one of TiN, tantalum nitride (TaN), and chromium (Cr) containing materials. In another embodiment, which can be combined with other embodiments described herein, the second material includes at least one of silicon oxide ($SiO_x$) and SiCN. In yet another embodiment, which can be combined with other embodiments described herein, the second material includes at least one of spin-on-carbon (SOC), photoresist, and bottom anti-reflective coating materials. In one embodiment, which can be combined with other embodiments described herein, the second erosion rate is greater than the first erosion rate when the device layer 308 is exposed to the ions 301 due to the etch chemistry of the ions 301. For example, the first material contains TiN, the second material contains $SiO_x$, and the etch chemistry of the ions 301 includes fluoromethane ($CH_3F$), diatomic oxygen ($O_2$), and a carrier gas, such as argon (Ar). When exposed to ions 301 generated by the etch chemistry of $CH_3F$, $O_2$, and Ar, the second material containing $SiO_x$ erodes at a greater rate than the first material containing TiN. Therefore, the distance 332 is decreased as the device layer 308 (or the substrate 302) is exposed to the ions 301. In another embodiment, which can be combined with other embodiments described herein, the second erosion rate is greater than the first erosion rate dependent of an etch chemistry of an etch process, such as $O_2$. When exposed to ions generated by the etch chemistry of $O_2$, the second material erodes at a greater rate than the first material. Optional operation 202, includes performing the etch process to decease the second height 316. In one embodiment, which can be combined with other embodiments described herein, the etch process is an isotropic etch process.

At operation 203, operation 201 is repeated to etch at least one subsequent depth 328 of a plurality of depths 327 of at the least one cavity 368 into the device layer 308 (or the substrate 302). As shown in FIG. 3D, in addition to the subsequent depth 328, the cavity 368 includes a subsequent leading sidewall portion 358 of the leading sidewall 359, a subsequent trailing sidewall portion 362 of the trailing sidewall 364, and a subsequent linewidth 365 from the subsequent leading sidewall portion 358 to the subsequent trailing sidewall portion 362. The subsequent leading sidewall portion 358 has a subsequent leading angle $\alpha_s$ corresponding to the ion angle ϑ relative to the surface normal 303. The subsequent trailing sidewall portion 362 has a subsequent trailing leading angle $\beta_s$ corresponding to the ion angle ϑ relative to the surface normal 303. The subsequent linewidth 365 is controlled by the distance 332 between a leading edge plane 334 and a trailing edge plane 336 increased by decreasing the second height 316. The distance 332 corresponds to the subsequent linewidth 365 as the ions 301 at the ion angle ϑ do not contact the device layer 308 (or the substrate 302) outside of the distance 332. As shown in FIG. 3E, optional operation 204 includes repeating optional operation 202 after each subsequent depth 328 of the at least one cavity 368 is etched.

FIG. 3F and FIG. 3G are schematic, cross-sectional views of the optical device structure 300. Operation 201 and optional operation 202 are repeated until the optical device structure 300 is formed when the least one cavity 368 has the plurality of depths 327 including the initial depth 325 and the at least one subsequent depth 328 corresponding to a fin depth. The at least one cavity 368 has a critical dimension 366. The critical dimension 366 is a full width at half maximum (FWHM) of exposed portions defined by adjacent remaining projections 313 and projections 311. Decreasing the initial depth 325 and each subsequent depth 328 will result in a smoother leading sidewall 359 of the least one cavity 368. A leading angle $\alpha$ of a plane 376 of the leading sidewall 359 measured relative to the surface normal 303 is about 15° to about 70°. A trailing angle $\beta$ of the trailing sidewall 364 measured relative to the surface normal 303 is about 20° to about 75°.

In one embodiment, which can be combined with other embodiments described herein, the initial patterned mask 310 and the at least one subsequent patterned mask 312 include non-transparent materials and are removed after the optical device structure 300 is formed. For example, the initial patterned mask 310 and the at least one subsequent patterned mask 312 include reflective materials, such as Cr or silver (Ag). In another embodiment, which can be combined with other embodiments described herein, the initial patterned mask 310 and the at least one subsequent patterned mask 312 include transparent materials such that the initial patterned mask 310 and the at least one subsequent patterned mask 312 remain after the optical device structure 300 is formed. In one embodiment, which can be combined with other embodiments described herein, the etch stop layer 306 is a non-transparent etch stop layer that is removed after the optical device structure 300 is formed. In another embodiment, which can be combined with other embodiments described herein, the etch stop layer 306 is a transparent etch stop layer that remains after the optical device structure 300 is formed.

Figure 4:
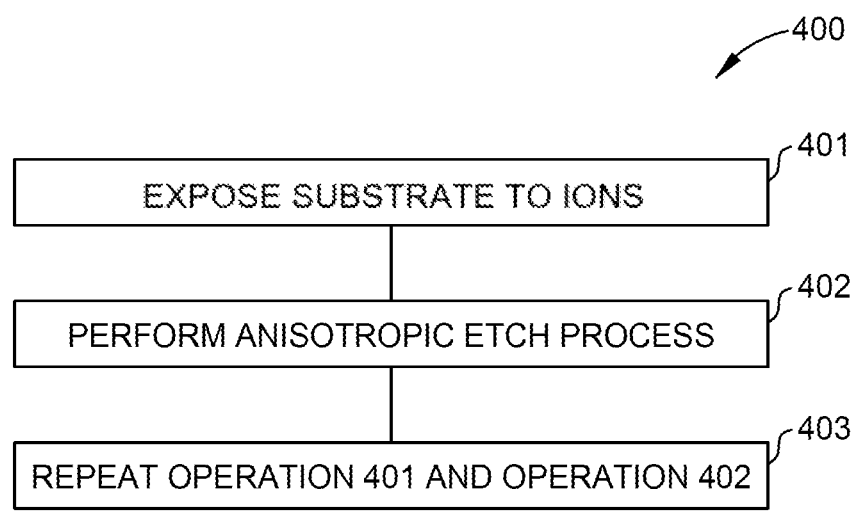
FIG. 4 is a flow diagram of a method for forming an optical device structure according to an embodiment.
Figure 5A:
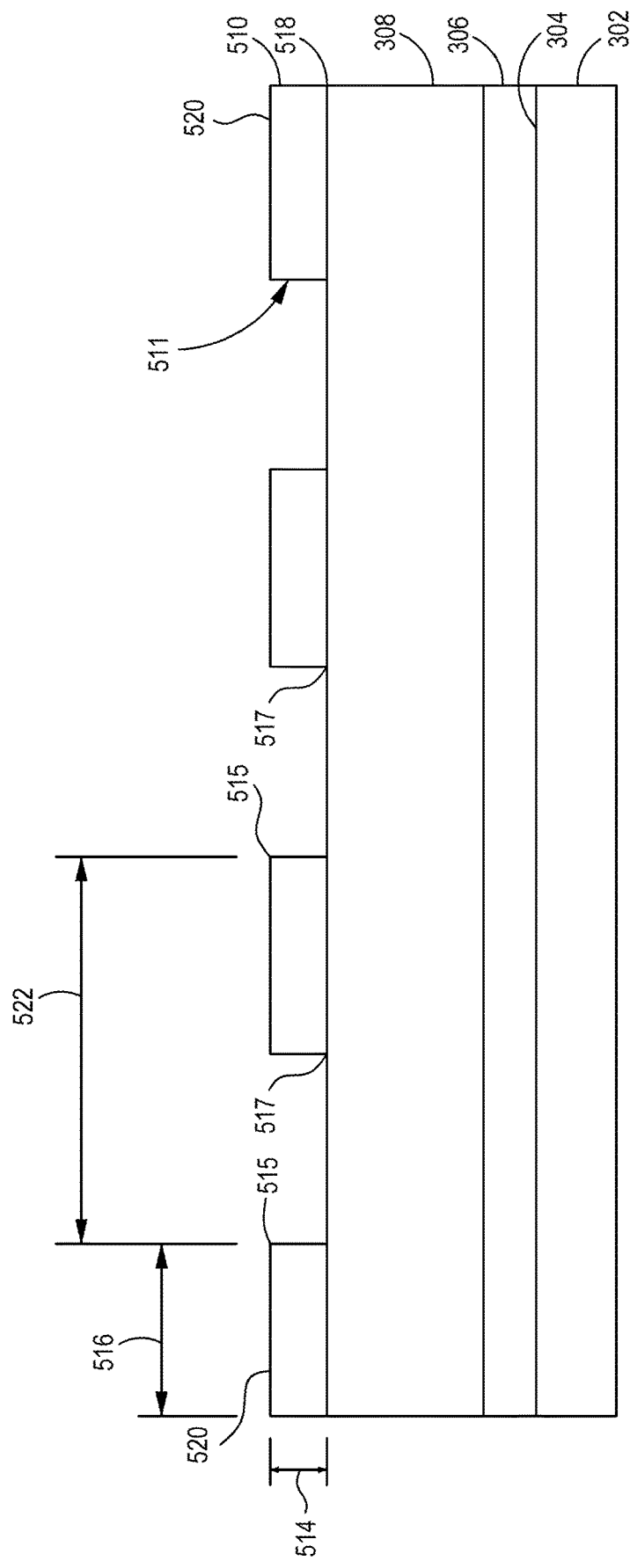
FIGS. 5A-5G are schematic, cross-sectional views of an optical device structure during a method for forming an optical device structure according to an embodiment.
Figure 5B:
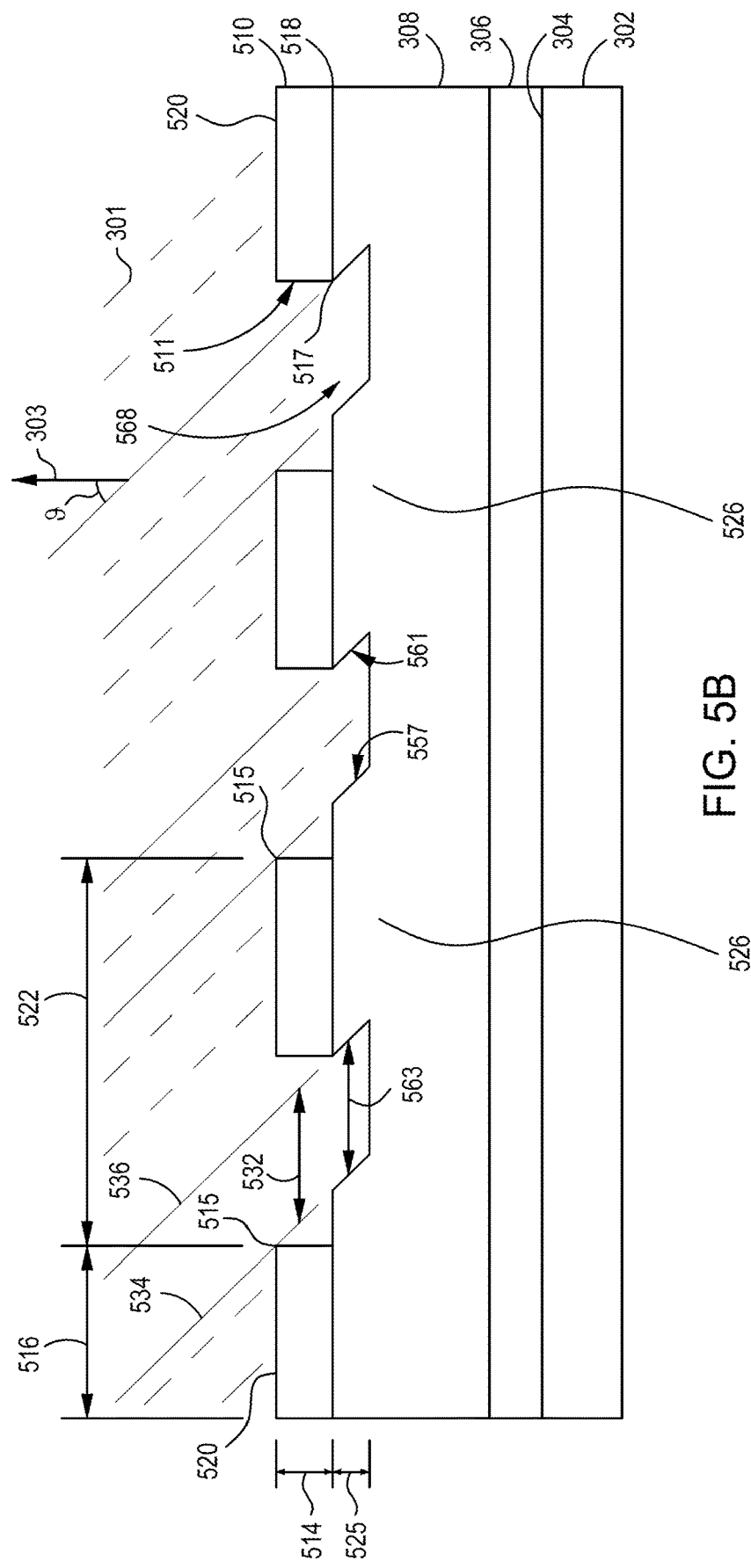
Figure 5C:
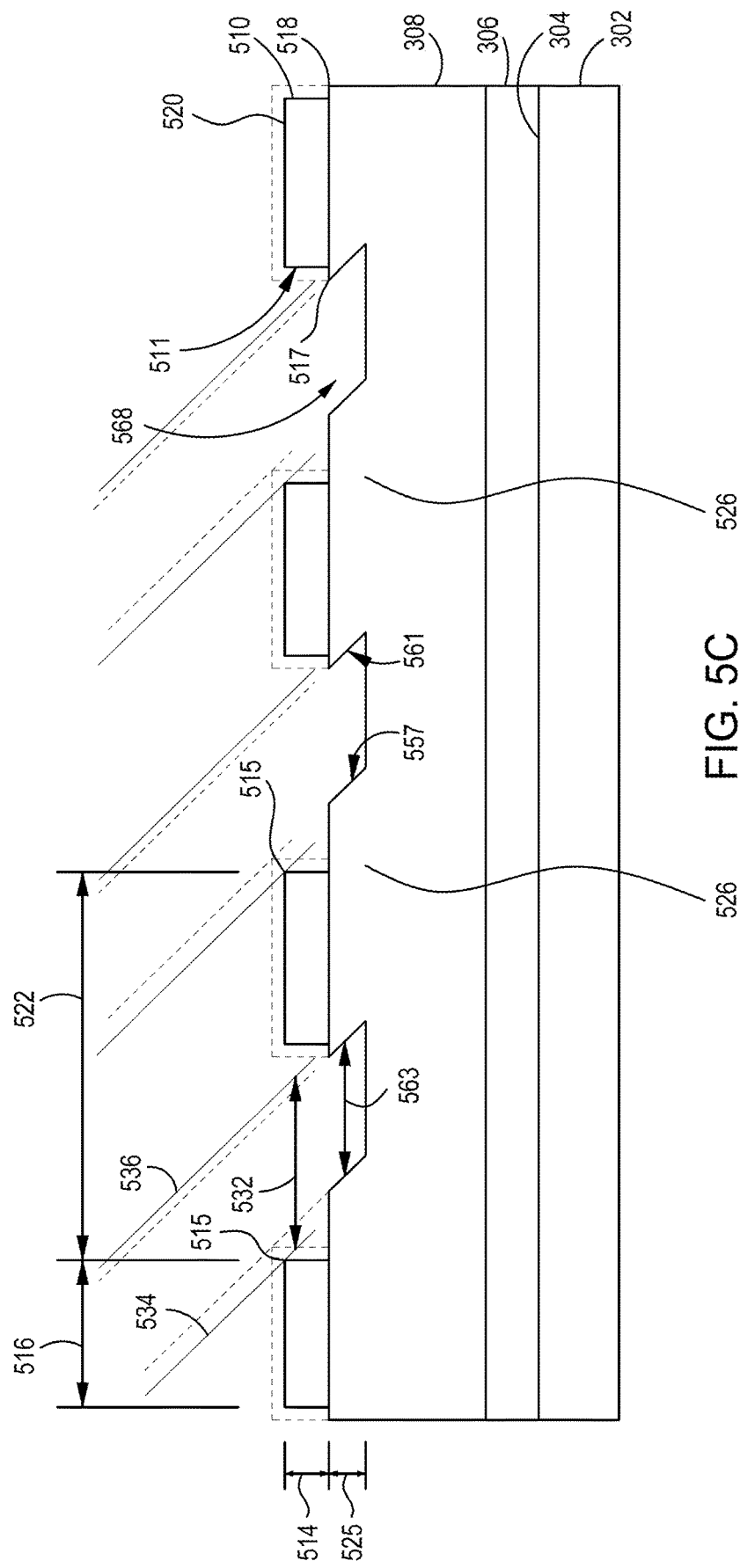
Figure 5D:
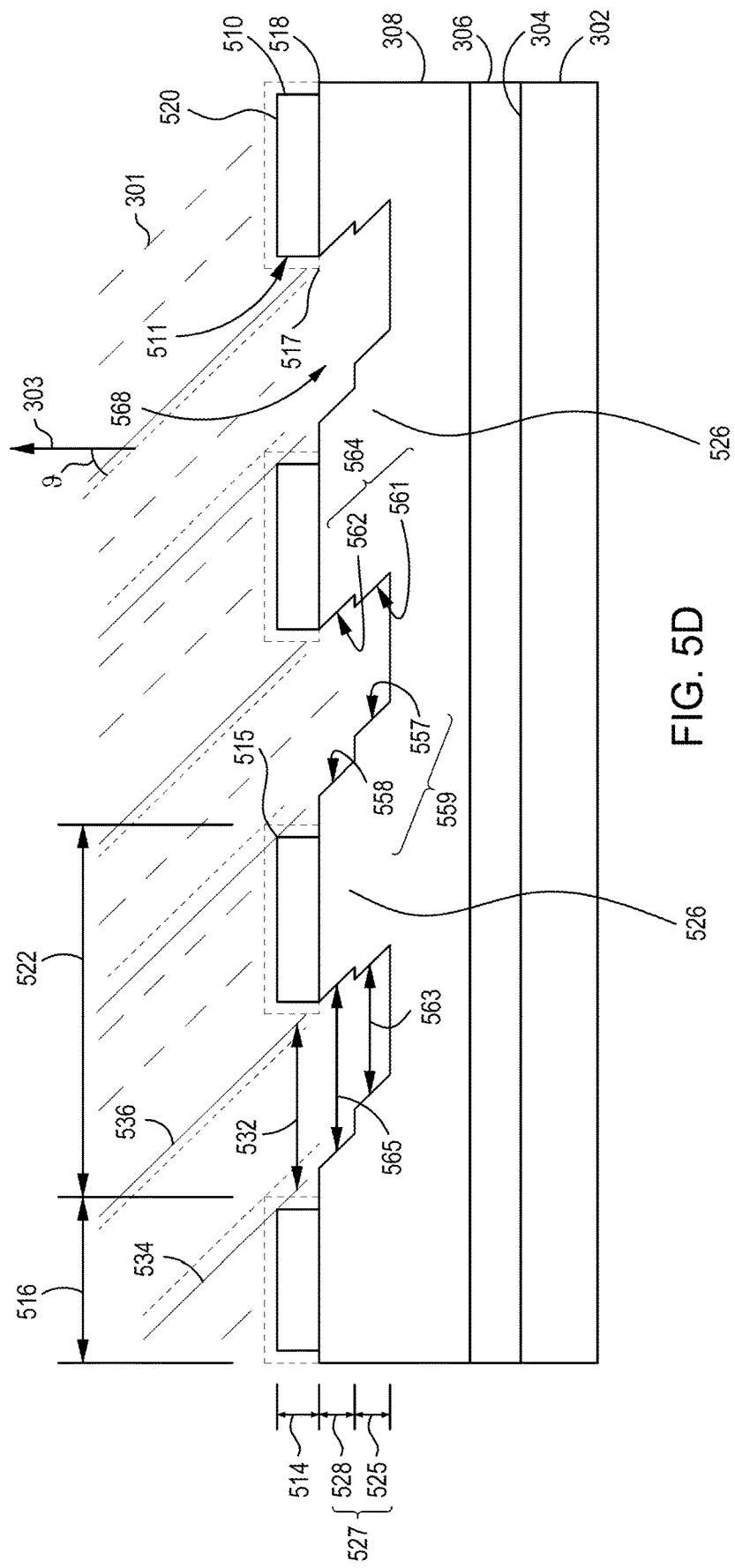
Figure 5E:
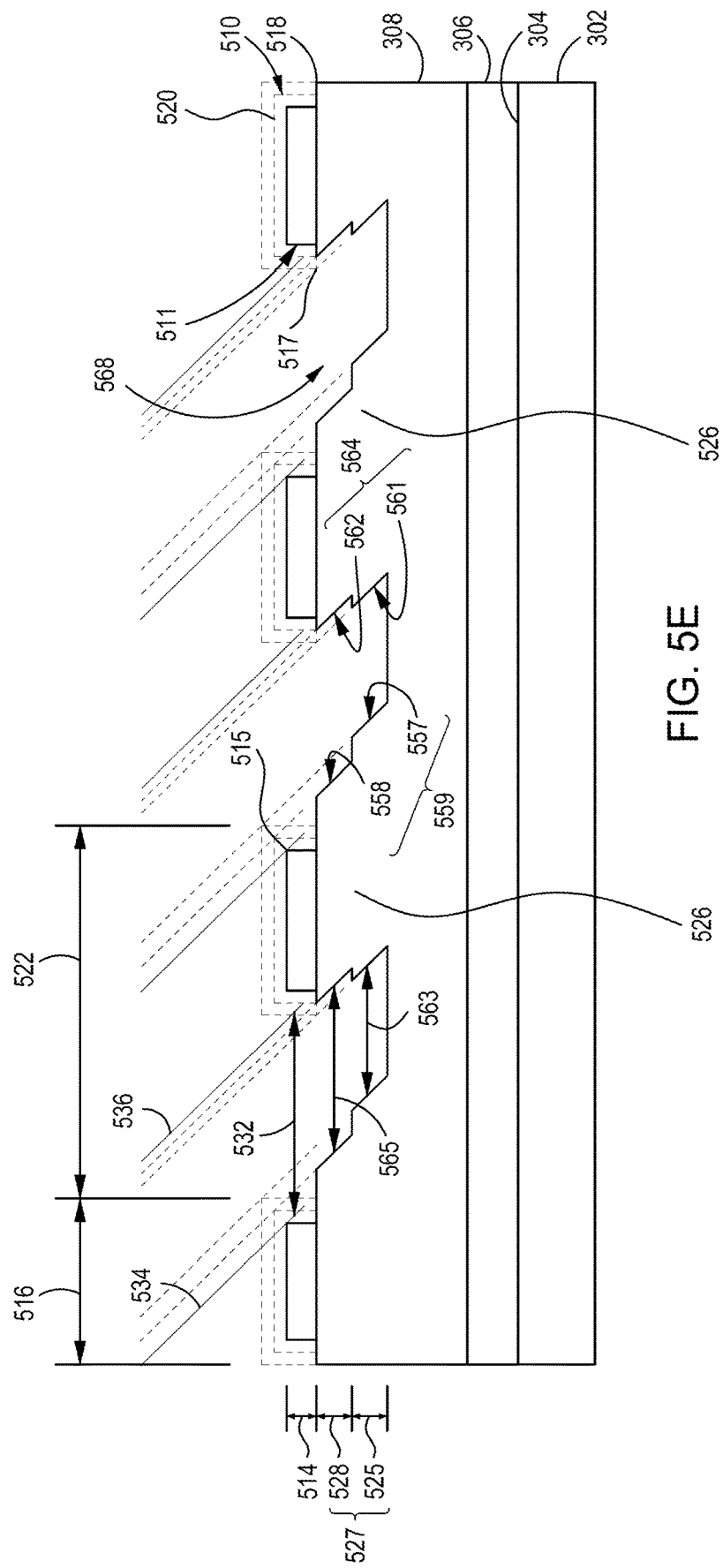
Figure 5F:
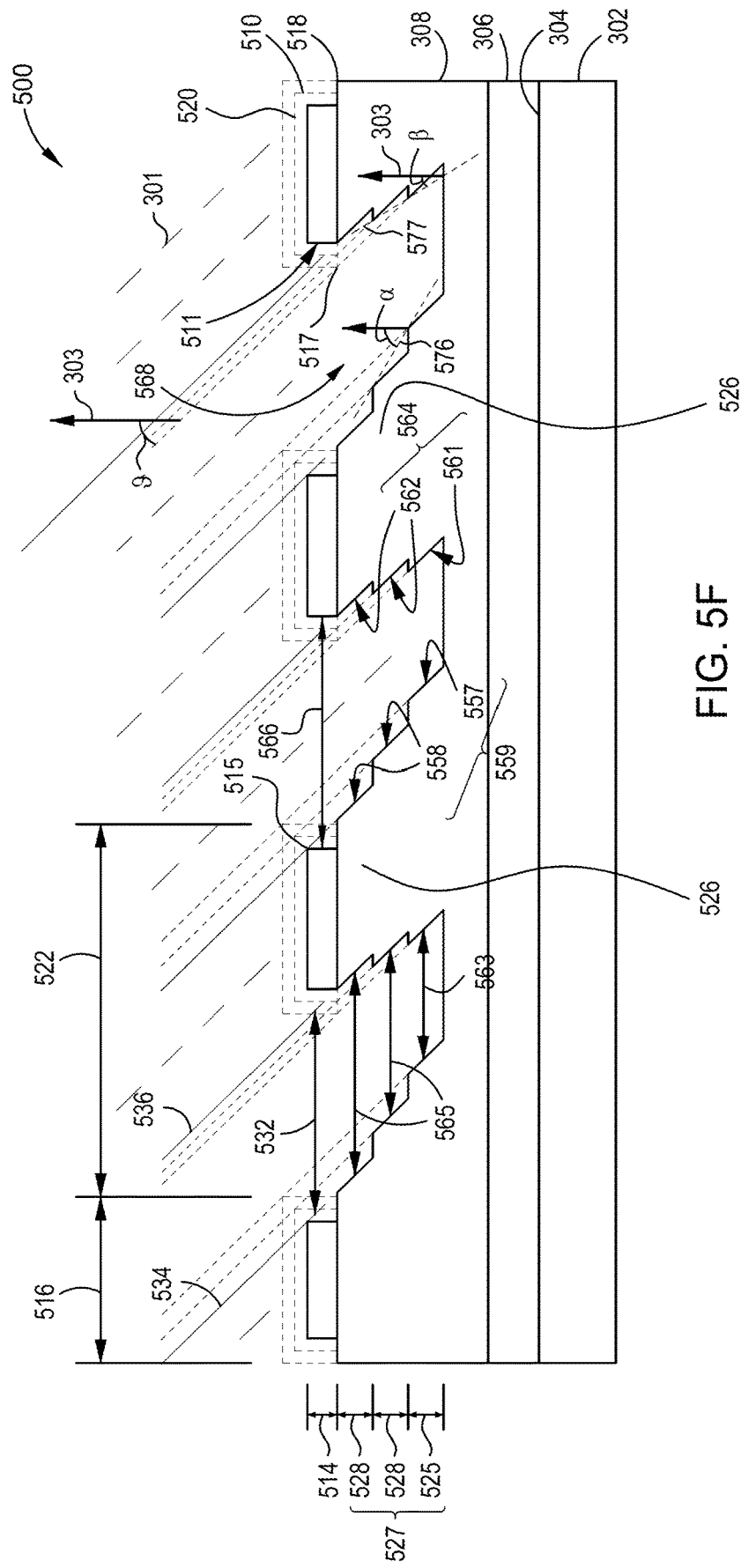
Figure 5G:
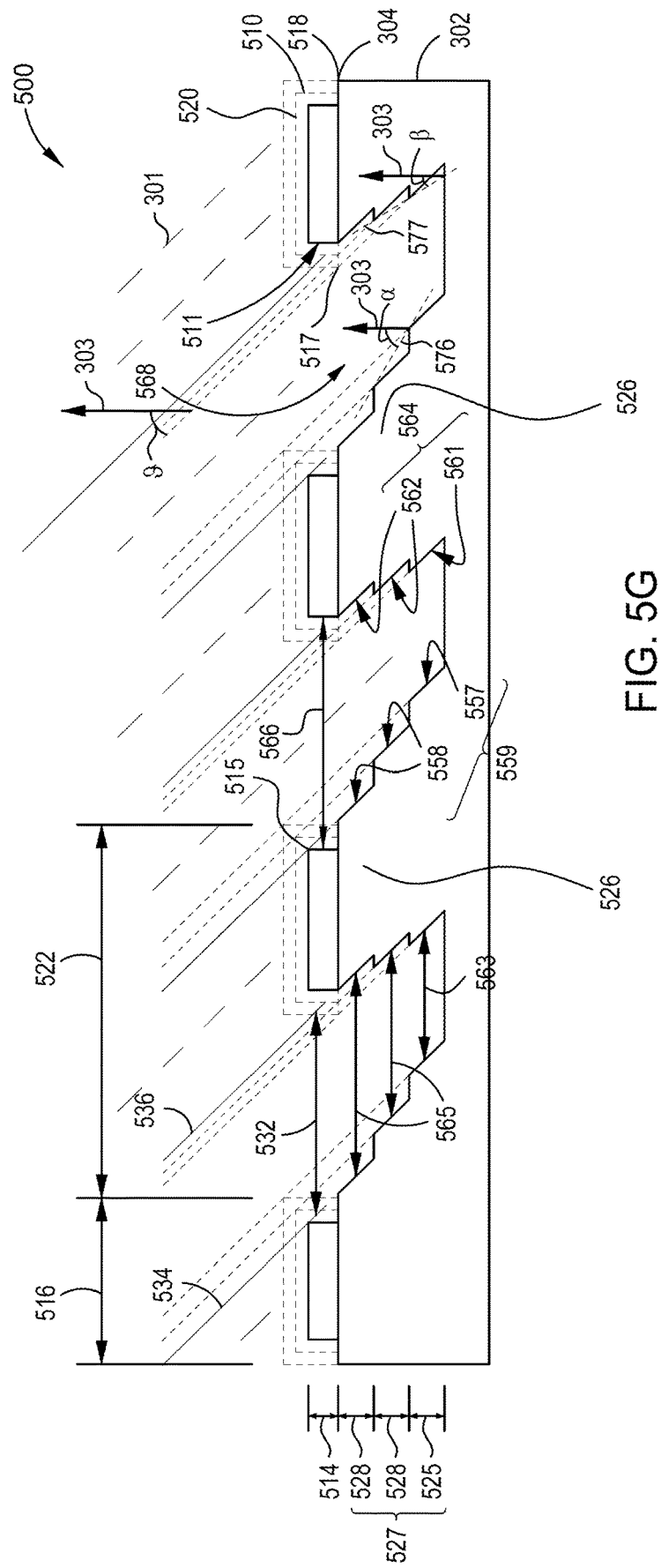

FIG. 4 is a flow diagram of a method 400 for forming an optical device structure 500 shown in FIGS. 5A-5G. In one embodiment, which can be combined with other embodiments described herein, the optical device structure 500 corresponds to the input coupling region 102 and/or the output coupling region 106 of the optical device 100. At operation 401, the substrate 302 is exposed to ions 301. In one embodiment, which can be combined with other embodiments described herein, the ions 301 contact the substrate 302 at an ion angle $\vartheta$ relative to a surface normal 303 of the surface 304 of the substrate 302. In another embodiment, which can be combined with other embodiments described herein, a device layer 308 is disposed over the substrate 302 such that the ions 301 contact the device layer 308 at the ion angle $\vartheta$ relative to the surface normal 303 of the surface 304 of the substrate 302. In one embodiment, the etch stop layer 306 is disposed between the device layer 308 and the surface 304 of the substrate 302. Exposing the device layer 308 to the ions 301 at the ion angle $\vartheta$ may include etching processes such as angled ion etching and directional RIE that accelerate ions 301 to the device layer 308 (or the substrate 302). As shown in FIG. 5F, when the device layer 308 is disposed over the substrate 302, the optical device structure 500 includes at least one fin 526 formed in the device layer 308. Otherwise, as shown in FIG. 5G, the optical device structure 500 includes at least one fin 526 formed in the substrate 302. While aspects of forming at least one fin 526 in the device layer 308 are discussed, it is to be understood that at least one fin 526 in the substrate 302 is similarly formed without the device layer 308 disposed thereon.

As shown in FIG. 5A, a patterned mask 510 is disposed on the device layer 308 (or the substrate 302). The patterned mask 510 includes two or more projections 511 defining exposed portions of the device layer 308 (or the substrate 302). Each projection 511 includes a leading edge 515 at a top surface 520 and a trailing edge 517 at a bottom surface 518 contacting the device layer 308 (or the substrate 302). The patterned mask 510 includes a pitch 522. The pitch 522 may be measured between adjacent trailing edges 517 or adjacent leading edges 515. Each projection 511 has a height 514 from the bottom surface 518 to the top surface 520.

As shown in FIG. 5B, ions 301 contact the device layer 308 (or the substrate 302) at the ion angle $\vartheta$ relative the surface normal 303 of the surface 304 of the substrate 302. The ions 301 etch an initial depth 525 of a plurality of depths 527 (shown in FIGS. 5D-5G) of at least one cavity 568 into the device layer 308 (or the substrate 302). As shown in FIGS. 5D-5G, each cavity 568 is between two adjacent fins 526. After operation 401, in addition to the initial depth 525, the cavity 568 includes an initial leading sidewall portion 557 of a leading sidewall 559, an initial trailing sidewall portion 561 of a trailing sidewall 364, and an initial linewidth 563 from the initial leading sidewall portion 557 to the initial trailing sidewall portion 561. The initial leading sidewall portion 557 has an initial leading angle $\alpha_i$ corresponding to the ion angle $\vartheta$ relative to the surface normal 303. The trailing sidewall portion 561 has an initial trailing angle $\beta_i$ corresponding to the ion angle $\vartheta$ relative to the surface normal 303. The initial linewidth 563 is controlled by a distance 532 between a leading edge plane 534 defined by the leading edge 515 at the top surface 520 and a trailing edge plane 536 defined by the trailing edge 517 at the bottom surface 518. The distance 532 corresponds to the initial linewidth 563 as the ions 301 at the ion angle $\vartheta$ do not contact the device layer 308 outside of the distance 532. The height 514 and a projection width 516 of each projection 511 is controlled, i.e., decreased, such that distance 532 is increased for at least one subsequent linewidth 365. As shown in FIG. 5C, operation 402 includes performing an anisotropic etch process to decease the height 514 and the projection width 516.

As shown in FIGS. 5D-5G, at operation 403, operation 401 and 402 are repeated to etch at least one subsequent depth 528 of a plurality of depths 527 of at the least one cavity 568 into the device layer 308 (or the substrate 302) until an optical device structure 500 is formed with the at least one cavity 568 having the plurality of depths 527 including the initial depth 325 and the at least one subsequent depth 528 corresponding to a fin depth. The cavity 568 includes at least one subsequent leading sidewall portion 558 of the leading sidewall 559, at least one subsequent trailing sidewall portion 562 of the trailing sidewall 564, and at least one subsequent linewidth 565 from the subsequent leading sidewall portion 558 to the subsequent trailing sidewall portion 562. The subsequent leading sidewall portion 558 has a subsequent leading angle as corresponding to the ion angle $\vartheta$ relative to the surface normal 303. The trailing sidewall portion 561 has a subsequent trailing angle $\beta_s$ corresponding to the ion angle $\vartheta$ relative to the surface normal 303. The subsequent linewidth 565 is controlled by the distance 532 between the leading edge plane 534 and the trailing edge plane 536 increasing by decreasing the height 514 and the projection width 516 via performing the anisotropic etch process. The distance 532 corresponds to the subsequent linewidth 365 as the ions 301 at the ion angle $\vartheta$ do not contact the device layer 308 (or the substrate 302) outside of the distance 532.

As shown in FIG. 5F and FIG. 5G, the at least one cavity 568 has a critical dimension 566. The critical dimension 566 is a FWHM of exposed portions defined by adjacent remaining projections 511. Decreasing the initial depth 525 and each subsequent depth 528 will result in a smoother leading sidewall 559 and a smoother trailing sidewall 564 of the least one cavity 568. A leading angle $\alpha$ of a plane 576 of the leading sidewall 559 measured relative to the surface normal 303 is about 15° to about 70°. A trailing angle $\beta$ of a plane 577 of the trailing sidewall 564 measured relative to the surface normal 303 is about 20° to about 75°. In one embodiment, which can be combined with other embodiments described herein, the patterned mask 510 includes non-transparent materials. Therefore, the patterned mask 510 is removed after the optical device structure 500 is formed. For example, the patterned mask 510 includes reflective materials, such as Cr or silver Ag) In another embodiment, which can be combined with other embodiments described herein, the patterned mask 510 includes transparent materials such that the patterned mask 510 remains after the optical device structure 500 is formed. In one embodiment, which can be combined with other embodiments described herein, the etch stop layer 306 is a non-transparent etch stop layer that is removed after the optical device structure 500 is formed. In another embodiment, which can be combined with other embodiments described herein, the etch stop layer 306 is a transparent etch stop layer that remains after the optical device structure 500 is formed.

In summation, methods of forming optical device structures with tapered fins are described herein. The utilization of hardmask shaping, i.e., controlling a distance between a leading edge plane defined by the leading edge of the patterned mask and a trailing edge plane defined by the trailing edge of the patterned mask, increases a linewidth of each fin and the depth of the fin, which enables the formation of tapered fins in a device layer of the optical device structures.

While the foregoing is directed to examples of the present disclosure, other and further examples of the disclosure may be devised without departing from the basic scope thereof, and the scope thereof is determined by the claims that follow.

What is claimed is:

1. A method comprising:
exposing a substrate to ions at an ion angle relative to a surface normal of a surface of the substrate to remove material of the substrate or a device layer disposed on the substrate to form an initial depth of a plurality of depths, wherein a patterned mask is disposed over the substrate and comprises:
two or more projections defining exposed portions of the substrate or a device layer disposed on the substrate, each projection having a trailing edge at a bottom surface contacting the substrate or the device layer, a leading edge at a top surface of each projection, and a height from the top surface to the substrate or the device layer; and
repeating the exposing the substrate to ions at the ion angle to form at least one subsequent depth of the plurality of depths, a distance from a leading edge plane of a leading edge to a trailing edge plane of a trailing edge increases at each subsequent exposure to ions at the ion angle forming subsequent depths having increasing linewidths.

2. The method of claim 1, wherein the exposing the device layer to ions includes angled ion etching or directional reactive ion etching.

3. The method of claim 2, wherein angled ion etching includes generating an ion beam and directing the ion beam at the ion angle to the substrate.

4. The method of claim 3, wherein the ion beam is a ribbon beam, a spot beam, or a full substrate-size beam.

5. The method of claim 1, wherein an anisotropic etch process is performed after the exposing the substrate to ions at the ion angle.

6. The method of claim 1, wherein the plurality of depths includes an initial leading sidewall portion, the initial leading sidewall portion having an initial leading angle corresponding to the ion angle.

7. The method of claim 1, wherein the substrate comprises at least one of an amorphous dielectric, a non-amorphous dielectric, a crystalline dielectric, a silicon oxide, a polymer, an oxide, a sulfide, a phosphide, a telluride, a silicon, a silicon dioxide, a sapphire, or a combination thereof.

8. The method of claim 1, wherein the patterned mask comprises a non-transparent material.

9. The method of claim 1, wherein the patterned mask comprises a transparent material.

10. A method comprising:
exposing a substrate to ions at an ion angle relative to a surface normal of a surface of the substrate to remove material of the substrate or a device layer disposed on the substrate to form an initial depth of a plurality of depths, wherein a patterned mask is disposed over the substrate and comprises:
two or more projections defining exposed portions of the substrate or a device layer disposed on the substrate, each projection having a trailing edge at a bottom surface contacting the substrate or the device layer, a leading edge at a top surface of each projection, and a height from the top surface to the substrate or the device layer; and
repeating the exposing the substrate to ions at the ion angle to form at least one subsequent depth of the plurality of depths, a distance from a leading edge plane of a leading edge to a trailing edge plane of a trailing edge increases at each subsequent exposure to ions at the ion angle forming subsequent depths having increasing linewidths, each subsequent linewidth is greater than a preceding linewidth of a preceding depth.

11. The method of claim 10, wherein the exposing the device layer to ions includes angled ion etching or directional reactive ion etching.

12. The method of claim 11, wherein angled ion etching includes generating an ion beam and directing the ion beam at the ion angle to the substrate.

13. The method of claim 12, wherein the ion beam is a ribbon beam, a spot beam, or a full substrate-size beam.

14. The method of claim 10, wherein an anisotropic etch process is performed after the exposing the substrate to ions at the ion angle.

15. The method of claim 10, wherein the plurality of depths includes an initial leading sidewall portion, the initial leading sidewall portion having an initial leading angle corresponding to the ion angle.

16. The method of claim 10, wherein the substrate comprises at least one of an amorphous dielectric, a non-amorphous dielectric, a crystalline dielectric, a silicon oxide, a polymer, an oxide, a sulfide, a phosphide, a telluride, a silicon, a silicon dioxide, a sapphire, or a combination thereof.

17. The method of claim 10, wherein the patterned mask comprises a non-transparent material.

18. The method of claim 10, wherein the patterned mask comprises a transparent material.

19. A method comprising:
exposing a substrate to ions at an ion angle relative to a surface normal of a surface of the substrate to remove material of the substrate or a device layer disposed on the substrate to form an initial depth of a plurality of depths, wherein a patterned mask is disposed over the substrate and comprises:
two or more projections defining exposed portions of the substrate or a device layer disposed on the substrate, each projection having a trailing edge at a bottom surface contacting the substrate or the device layer, a leading edge at a top surface of each projection, and a height from the top surface to the substrate or the device layer; and
repeating the exposing the substrate to ions at the ion angle to form at least one subsequent depth of the plurality of depths, a distance from a leading edge plane of a leading edge to a trailing edge plane of a trailing edge increases at each subsequent exposure to ions at the ion angle forming subsequent depths having increasing linewidths, wherein the plurality of depths includes an initial leading sidewall portion, the initial leading sidewall portion having an initial leading angle corresponding to the ion angle.

20. The method of claim 19, wherein the substrate comprises at least one of an amorphous dielectric, a non-amorphous dielectric, a crystalline dielectric, a silicon oxide, a polymer, an oxide, a sulfide, a phosphide, a telluride, a silicon, a silicon dioxide, a sapphire, or a combination thereof.

* * * * *